US008081515B2

(12) United States Patent
Satoh

(10) Patent No.: US 8,081,515 B2
(45) Date of Patent: Dec. 20, 2011

(54) TRENCH MONOS MEMORY CELL AND ARRAY

(75) Inventor: Kimihiro Satoh, Portland, OR (US)

(73) Assignee: Trom, Beaverton, OR (US)

( * ) Notice: Subject to any disclaimer, the term of this patent is extended or adjusted under 35 U.S.C. 154(b) by 138 days.

(21) Appl. No.: 12/384,550

(22) Filed: Apr. 6, 2009

(65) Prior Publication Data
US 2009/0251973 A1 Oct. 8, 2009

Related U.S. Application Data

(60) Provisional application No. 61/072,977, filed on Apr. 4, 2008, provisional application No. 61/192,160, filed on Sep. 16, 2008.

(51) Int. Cl.
*G11C 16/04* (2006.01)
(52) U.S. Cl. ......... 365/185.18; 365/185.29; 365/185.05; 365/185.14; 365/174; 257/324; 257/E29.309

(58) Field of Classification Search ............. 365/185.18, 365/185.29, 185.05, 185.14, 174; 257/324, 257/E29.309
See application file for complete search history.

(56) References Cited

U.S. PATENT DOCUMENTS

| 4,774,556 A | 9/1988 | Fujii et al. |
| 5,229,312 A | 7/1993 | Mukherjee et al. |
| 5,966,603 A | 10/1999 | Eitan |
| 6,051,860 A | 4/2000 | Odanaka et al. |
| 2007/0187746 A1* | 8/2007 | Kashimura ................ 257/315 |
| 2008/0057647 A1* | 3/2008 | Ho et al. .................... 438/259 |

* cited by examiner

*Primary Examiner* — Fernando N. Hidalgo
(74) *Attorney, Agent, or Firm* — Saile Ackerman LLC; Stephen B. Ackerman; Rosemary L. S. Pike

(57) ABSTRACT

The MONOS vertical memory cell of the present invention allow miniaturization of the memory cell area. The two embodiments of split gate and single gate provide for efficient program and erase modes as well as preventing read disturb in the read mode.

13 Claims, 15 Drawing Sheets

TRENCH MONOS MEMORY CELL AND ARRAY

This patent application claims the benefit of Provisional U.S. Patent Application Ser. No. 61/072,977, filed on Apr. 4, 2008 and Provisional U.S. Patent Application Ser. No. 61/192,160, filed on Sep. 16, 2008.

BACKGROUND OF THE INVENTION (1) Field of the Invention

The Invention relates to a non-volatile memory device, and more particularly, to a MONOS memory storage device.

(2) Description of the Related Art

MONOS (metal oxide nitride oxide silicon) device provides many advantages when implemented as a non-volatile memory element. It has good potential to achieve low voltage, high speed, and high density.

Eitan provides a double bit memory device using a MONOS stack layer, called NROM, in U.S. Pat. No.5,966,603,as shown in FIG. 1. The gate oxide of a conventional NMOS device is simply replaced by a composite layer 12 of ONO (Oxide-Nitride-Oxide). The nitride layer 14 in the middle of the stack stores memory charge. Channel hot electrons are injected into the nitride storage region 16 over the drain side P-N junction. Since drain and source are symmetrical and convertible, the device can have two separate storage nodes in a nitride layer over each of the two P-N junctions, thus a single device can have two bits of memory in a unit cell. This NROM structure has some issues and challenges. The first issue is the shift up of threshold voltage (Vt) with program-erase cycling. Channel hot electrons are mostly injected at the edge of the channel, but a few electrons may also find their way to the center of the channel. Electrons stored over the middle of the channel are difficult to be neutralized by the hot hole injection erase operation and, thus, accumulate during repeated program-erase cycles. Another issue is read disturb. The voltage conditions for read are reversed from the voltage direction for program in that the source and drain are switched. During a normal read operation, the unselected bit in the unit cell may become lightly programmed, which leads to a Vt shift up on the unselected side over time.

Odanaka et al teach a Twin MONOS structure, as shown in FIG. 2, in U.S. Pat. No. 6,051,860. This structure has no nitride layer over the middle of a channel. Two memory gates 20 having underlying nitride storage 16 and a MOS gate 22 in between are placed over the channel. The middle MOS gate 22 works as a select gate. Since the middle gate has no nitride layer, no electrons or holes are injected or ejected. This channel profile is convenient for low voltage and fast program or erase. However, read disturb can occur due to injection of electrons into the unselected memory side during read. Program speed can be compromised when the other unselected side is programmed since program current is reduced.

Another issue is punch through due to short channel at read mode. While a channel length of FIG. 1 is that of a conventional n-MOS, a higher voltage than the n-MOS is applied to the drain in order to extend the depletion region under the storage on the drain side. Its effective channel becomes considerably shorter than n-MOS. The unselected gate in FIG. 2 is overridden by applying a high voltage, where the depletion region is extended under the select gate channel. Its effective channel length also becomes shorter than n-MOS. It is getting difficult to squeeze in a channel length of a CMOS device. It is more difficult for the two prior arts to squeeze their cell size.

U.S. Patent Application 2008/0057647 to Ho et al discloses forming a SONOS select gate in the bottom of a trench and a memory transistor with ONO in the upper portion of the trench. This device uses a conventional planar select transistor in series with a trench ONO device. It is geared more towards an integrated process which provides a low voltage cell operation compared to conventional floating gate devices.

U.S. Patent Application 2007/0187746 to Kashimura shows a vertical memory cell within a trench where the control gate is at the bottom of the trench and the word gate is at the top of the trench. In this device structure, the source and drain diffusions are both either at the very bottom of the trench in one embodiment, or both at the top of the mesa (i.e. along the surface of the substrate) in another embodiment. A pair of memory cells share a U-shaped channel. Its profile is symmetric. It would help issues for punch through and miniaturization, but not issues for read disturb and program speed when the other side cell is programmed, which prevent the pair from working as a dual bit.

U.S. Pat. No. 5,229,312 to Mukherjee et al shows a memory cell formed in a trench with ONO between the bottom and top gates. However, charge is stored in a floating gate, not in the nitride of the ONO layer. The ONO acts as an inter-gate dielectric, not as a memory layer.

U.S. Pat. No. 4,774,556 to Fujii et al has device separated into top and bottom diffusions, but the deposition of nitride is asymmetrical.

SUMMARY OF THE INVENTION

Vertical features are proposed in this invention to break through the scaling limitations of a conventional planar device. The first embodiment is of a split gate type device. The second embodiment is of a single gate.

In the first embodiment, the vertical channel is defined in the p-region between top and bottom n-regions along a trench split gate pair. A bottom part of the split gate is used to select an odd or even column. The select gate consists of a gate electrode and gate oxide in between the channel and the gate electrode. A top part of the split gate pair is used to control device operations, such as write, erase and read. The control gate consists of a gate electrode and an oxide-nitride-oxide (ONO) stack layer in between the gate electrode and the vertical channel. The nitride layer in the stack layer works as a memory element trapping electrons in it. The stack layer is also placed in between the top gate electrode and the bottom gate electrode to separate the gates.

Vertical structure can accelerate miniaturization of the memory cell area since horizontal gate width is converted to a vertical component, which does not contribute to cell area. A conventional horizontal MOS device could not be smaller than 2F×2F, where F is defined as minimum feature size, since minimum pitches both in the x-direction and the y-direction are 2F. It is provided in this invention that the unit cell area can be reduced to 2F×1F. A pitch along the x-direction is placed by 2F as control gate (CG) line/space and along the y direction is 2F as bit line/space. SG (select gate) is plugged between bit lines. Two MOS device channels run vertically along both bit line edges so that contribution to unit cell is 1F.

A vertical device also is free from short channel issues as seen in a planar device. The channel length of the vertical device is adjusted by the depth of the p layer, not limited by feature size. CG channel length is also adjusted by its depth.

The Channel impurity profile is important for device operations of read, program and erase. A clear concentration difference at the drain side PN junction manipulates hot electron and hot hole generation. This is convenient for program and erase mode operation, but not for read. The hot charges are injected and cause read disturb. The top n+ layer located in the control gate channel has a comparably high concentration to allow hot charge generation. The bottom PN junction is located in the select gate channel. Its concentration profile is controlled as a gradient. Program mode applies positive voltage on the top n+ layer. Read mode applies positive voltage on the bottom n+ layer. This voltage arrangement, opposite to program mode, is called 'reverse read'. The gradient profile helps to prevent read disturb.

The memory array of the present invention consists of control gate lines, select gate lines and bit lines. A select gate and a bit line run together in parallel. The control gate crosses the select gate and the bit line. The select gate surrounding a bit line is separated by an edge cut into two parts to select an odd or even bit line space.

Another MONOS device having a vertical channel is provided in the second embodiment where the channel is defined in the p-region along a word gate between the top n+ and lower n− regions. The word gate dielectric is oxide-nitride-oxide. The nitride layer is a memory element. The gate structure is a single gate, different from the first embodiment of a split gate. A word gate line runs across a bit line connecting the top n+ region defined by self-alignment during bit line wiring. The bottom n+ layer is separated into two blocks to select an odd or even cell. A memory cell is selected by a bit line, a word line and a bottom n+ layer.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
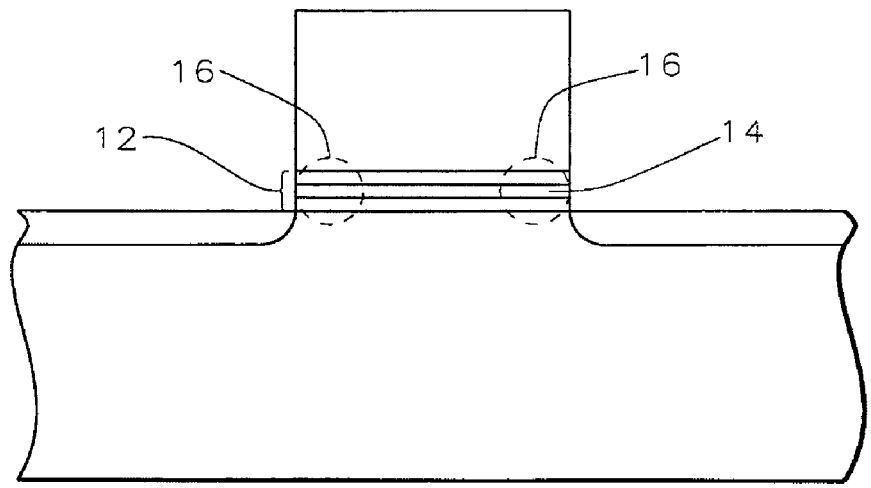
FIG. 1 is a cross-sectional representation of a first prior art.
Figure 2:
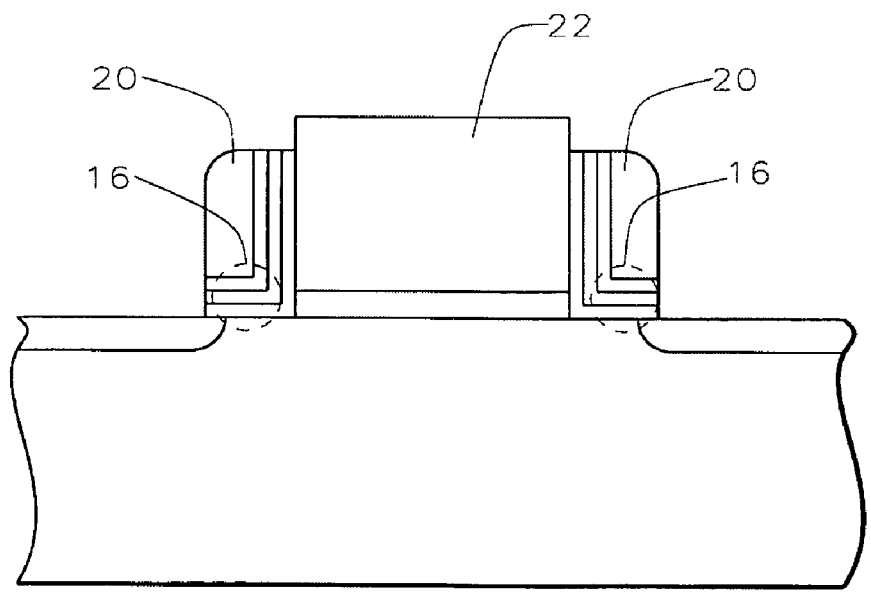
FIG. 2 is a cross-sectional representation of a second prior art.
Figure 3:
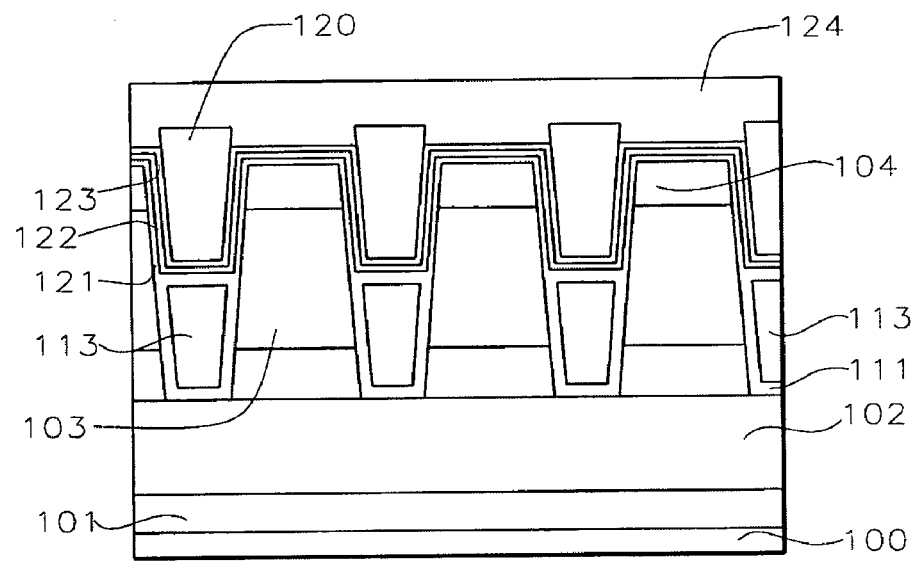
FIG. 3 is a cross-sectional representation of a first embodiment of the present invention.

The cross-sectional memory structure of the first embodiment of the invention is shown in FIG. 3. The vertical channel is in the p-region 103 between top 104 and bottom 102 n-regions along a trench split gate pair of a control gate 120 and select gate 113. A bottom part of the split gate is used to select an odd or even column. The select gate consists of a gate electrode 113 and gate oxide 111 in between the channel and the gate electrode. A top part of the split gate pair is used to control device operations such as write, erase and read. The control gate consists of a gate electrode 120 and a stack of oxide 121 nitride 122 and oxide 123 in between the gate electrode and the vertical channel. Nitride layer 122 in the stack layer functions as a memory element. The stack layer is also in between the top gate electrode and the bottom gate electrode to separate the gates.

The bottom of the select gate is located deeper than the bottom p-n junction defined by the boundary of the n-region 102 and the p-region 103. The bottom of the control gate is adjusted to be lower than the top junction defined by the boundary of the n-region 104 and the p-region 103. The impurity concentration of the top n+ layer is high to promote channel hot electron injection and/or hot hole injection. The bottom junction is adjusted and graded to prevent injections during a read operation.

Figure 4:
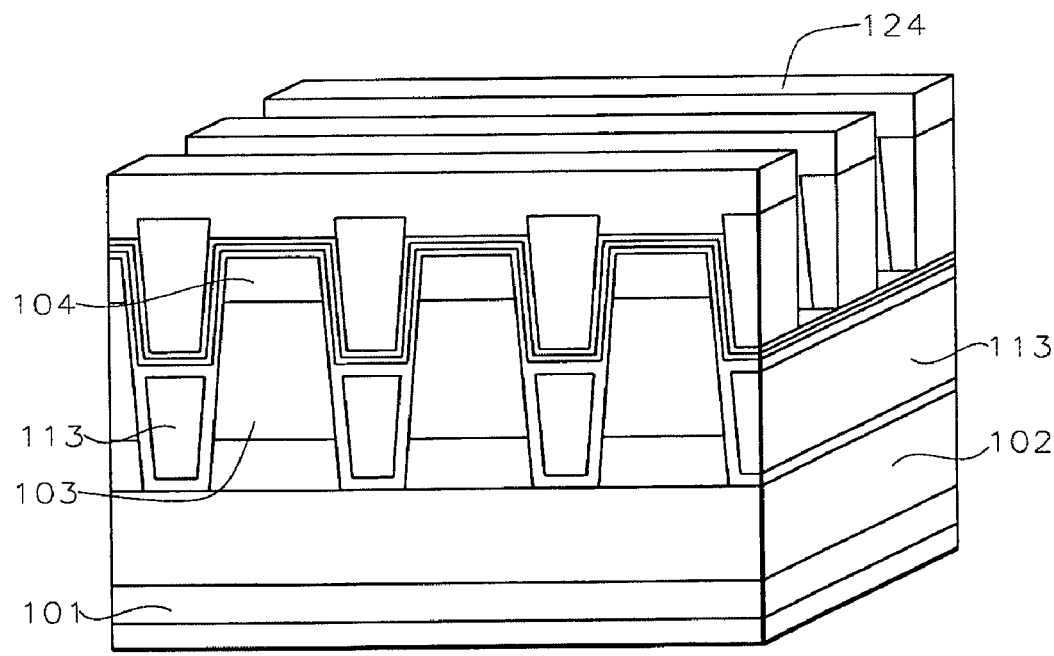
FIG. 4 is a three dimensional representation of a first embodiment of the present invention.
Figure 5:
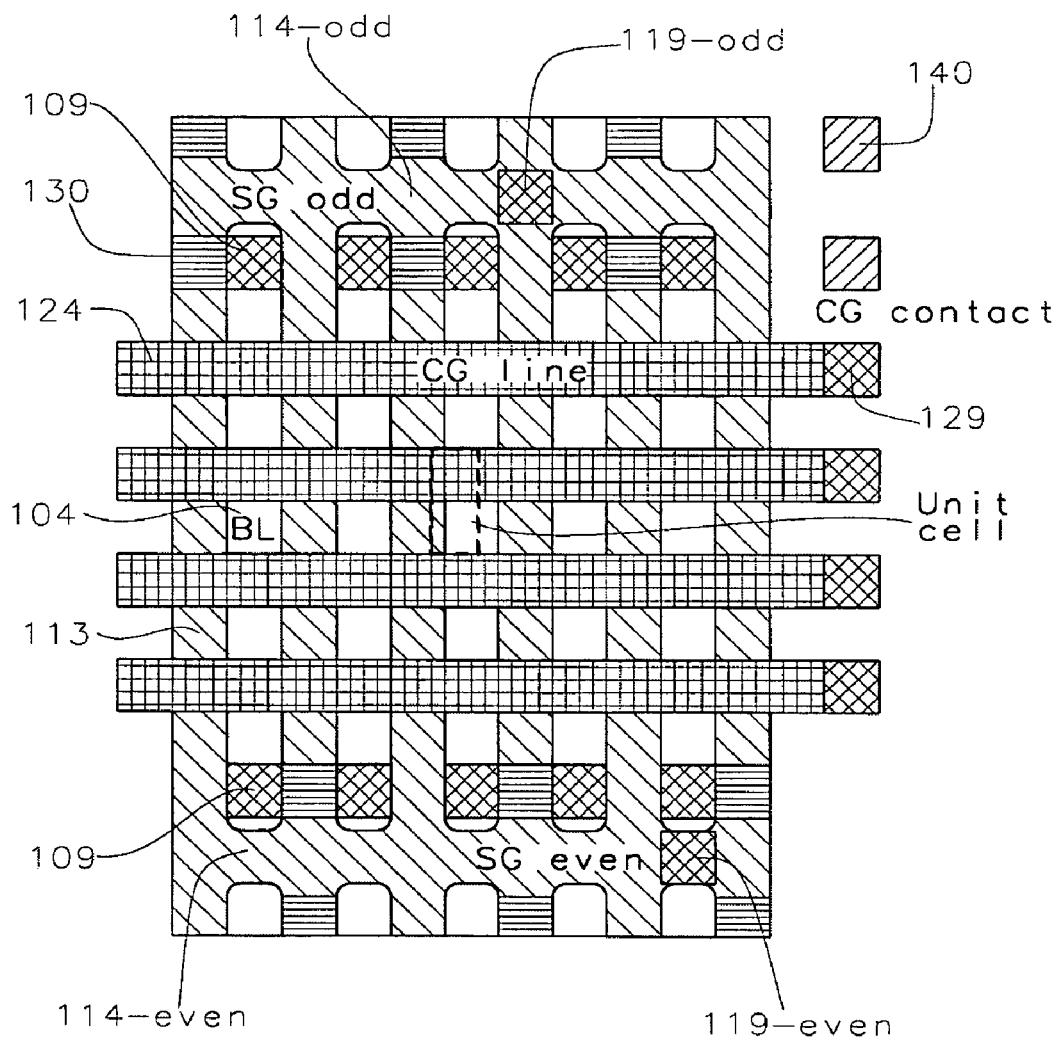
FIG. 5 illustrates a top view of a first embodiment of the present invention.

A three dimensional view and top view of the memory cell array are shown in FIG. 4 and FIG. 5, respectively. The select gate 113 surrounds bit line 104. Each side of a bit line is selected by the select gate. SG odd/even separation 130 separates the select gate into odd part 114-odd and even part 114-even, shown in FIG. 5. Common source CS is connected through CS contact 140 in FIG. 5 to bottom n+ layer 101 in FIG. 4.

The operating channel is selected by the select gate. A control gate 124 runs across the bit lines and select gates. A control gate contact 129 is placed at end of the line, as shown in FIG. 5. Bit line contacts 109 are placed at the end of the line, as shown in FIG. 5. A select gate contact 119-odd or 119-even is placed in SG-odd 114-odd or SG-114-even, respectively. Assuming a bit line pitch of 2F and CG pitch of 2F, where F is the minimum feature size, the unit cell area is can be defined as $(2F) \times (2Ff)/2 = 2F^2$, since two cells share a bit line, as shown in FIG. 5.

Figure 6:
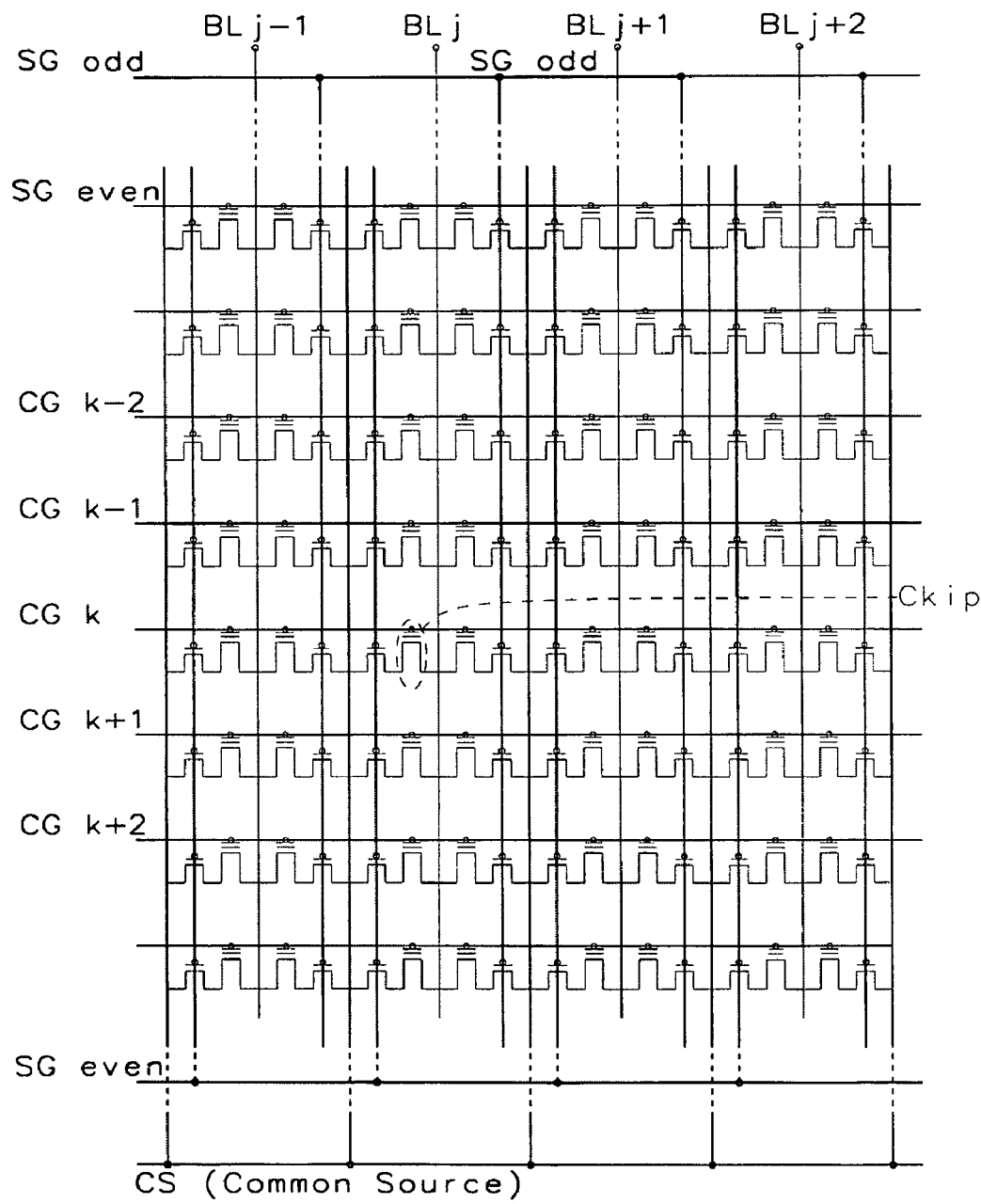
FIG. 6 is an equivalent electrical circuit diagram of a first embodiment of the present invention.

The equivalent electrical circuit of the memory array is shown in FIG. 6. Plural bit lines run along the same direction as the select gates. Select gates are bundled as even SG and odd SG. Plural control gates run across the bit lines. Two memory cells share a bit line. A memory cell Ckjp is selected by control gate CGk, bit line BLj and select gate SGp, where p denotes parity of odd or even. Positive voltages are applied to a control gate CGk, a bit line BLj and a select gate SGp and all others are grounded to inject electrons in programming mode. For example, program voltages could be CGk 5V, BLj 5V, SG even 1V, all others 0V. For read mode, positive voltages are applied to a common source CS, a control gate CGk and a select gate SGp. Bit lines, unselected CGs, and other SG are grounded. Its voltage arrangement of the selected bit line and common source is opposite to that of program. For example, read voltages could be CGk 1.5V, SG even 1.5V, CS 1.2V, all others 0V. A negative voltage is applied to the control gate for the erase operation and a positive voltage is applied to the bit line, the common source is grounded, and 0V or a negative voltage is applied to the select gate CS. For example, erase voltages could be CGk −3V, BLj 5V, all others 0V.

Figure 7:
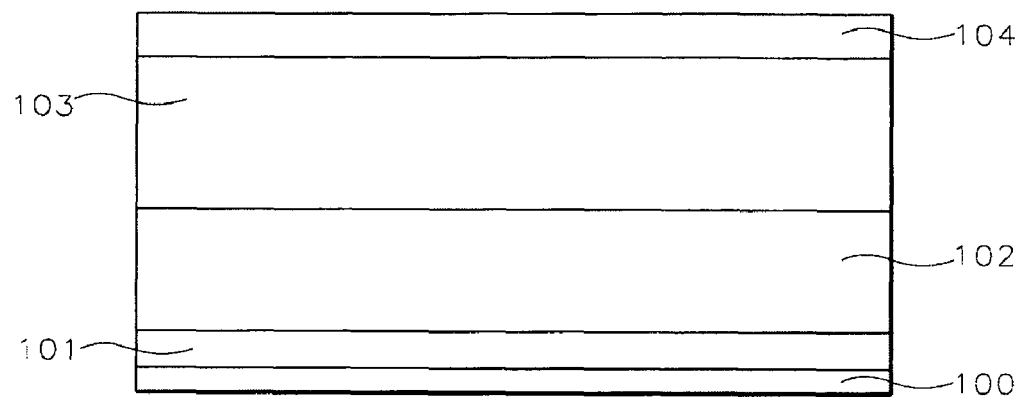
FIG. 7 to FIG. 12 illustrate, in cross-sectional representation, individual fabrication steps of the first embodiment of the present invention.

The fabrication method of the first embodiment will be described with reference to FIGS. 7 through 12. Referring now more particularly to FIG. 7, a high concentration n type layer 101 is formed over p type substrate 100 with ion implantation or epitaxial growth. The n+ layer is to be a common source as well as a bottom electrode. A low concentration n type layer 102 is grown over n+ layer 101. The n− layer makes a gentle gradient impurity profile of p-n junction with the upper p type layer. This gradient will prevent injections during a read operation. A p type layer 103 is grown over the n− layer 102. The p layer becomes a channel bounded by bottom and top p-n junctions. An n-type impurity ion implantation is performed over p layer 103 to form n+ layer 104. The large impurity concentration difference between the n+ layer 104 and p layer 103 promotes hot electron/hole generation. It is convenient for program and erase.

Figure 8:
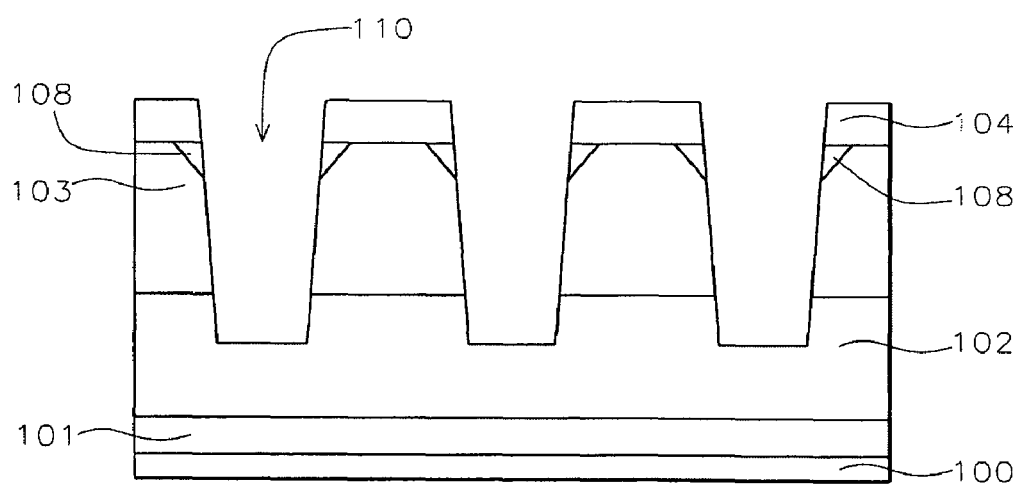

Referring now to FIG. 8, a trench mask is patterned on the surface with a conventional lithography process. The trench runs along the first direction. A silicon etch is performed to about half way through the p layer 103. Lightly doped drain (Ldd) 108 may be implanted.

A second silicon etch is performed, reaching into the n− layer 102 to make a trench 110. The bottom of the trench is below the lower junction between p layer 103 and n− layer 102. The trench becomes a select gate. The remaining n+ layer 104 becomes the bit line. All the trenches are connected together. The trench areas are separated into two parts with a SG isolation mask 130 as shown in FIG. 5

Figure 9:
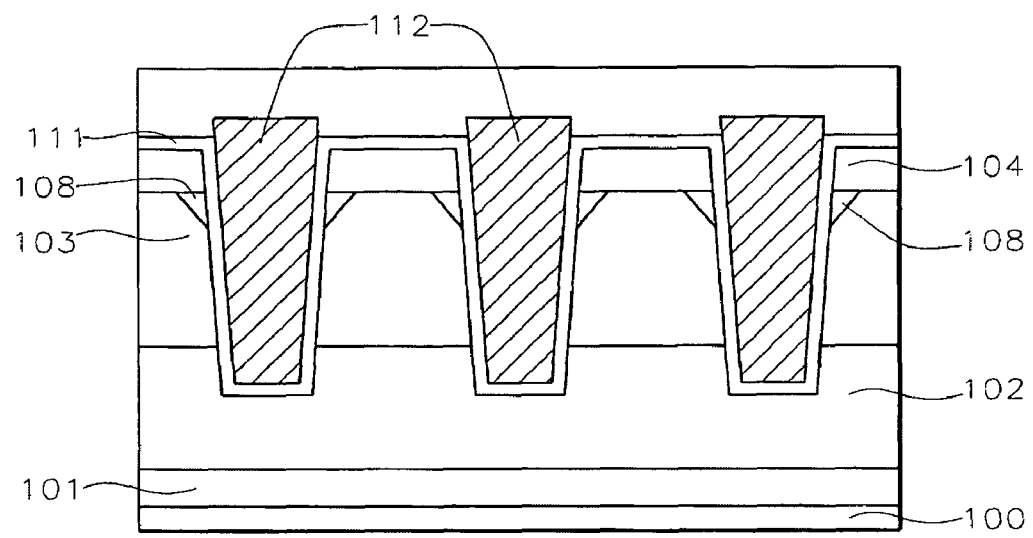
Figure 10:
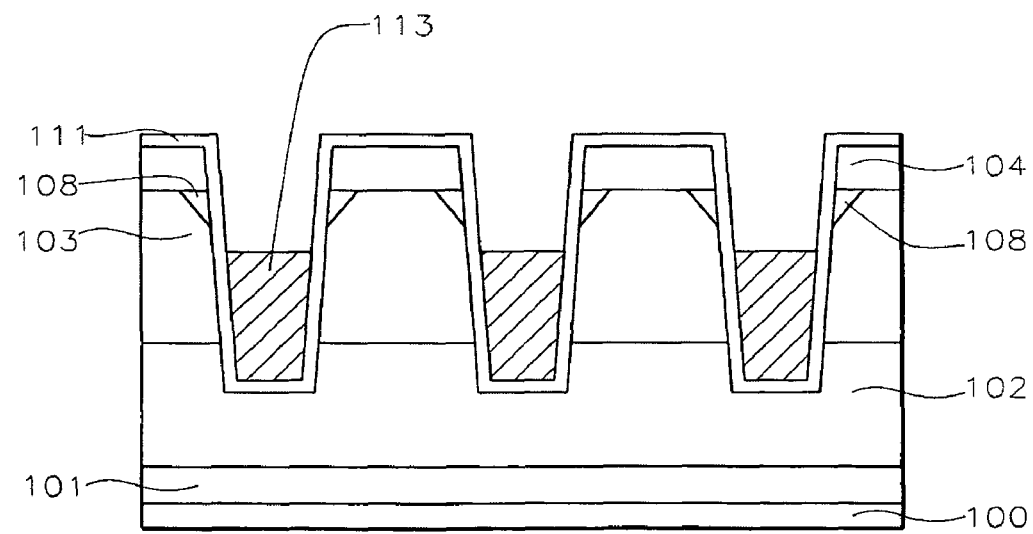

Gate oxide 111 in FIG. 9 is grown inside of the trench 110 surface. P or n doped polysilicon 112 is deposited to plug the trench. The polysilicon layer may be planarized by chemical mechanical polishing (CMP). The planarized polysilicon is vertically etched until a control gate trench 120 reaches into p layer 103, as shown in FIG. 10. The top of the recessed polysilicon 113 is lower than the bottom of the n+ layer 104. The trench 120 depth defines the control gate channel. The distance is adjusted by the polysilicon recess etching to get appropriate control gate channel length. A channel length of a select gate is given by a distance of the top of recessed polysilicon 113 to bottom of p layer 103.

Figure 11:
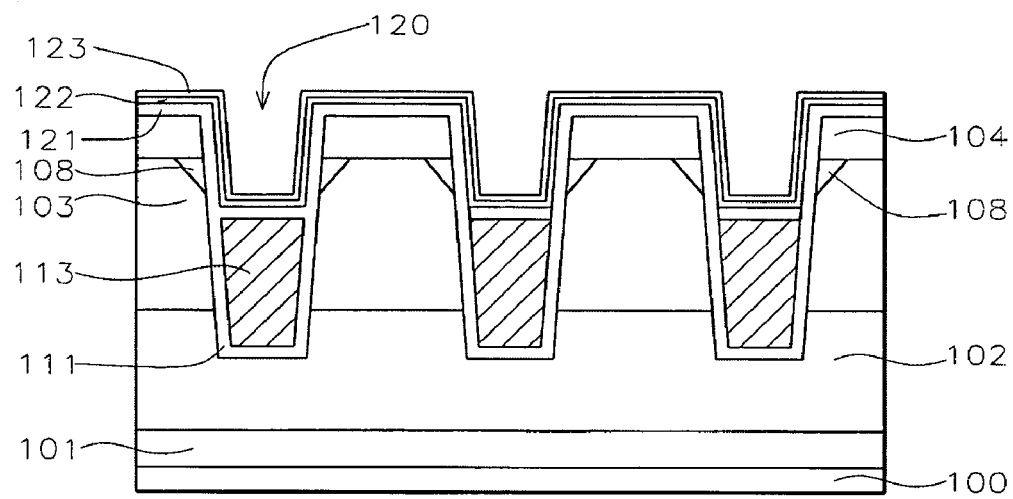
Figure 12:
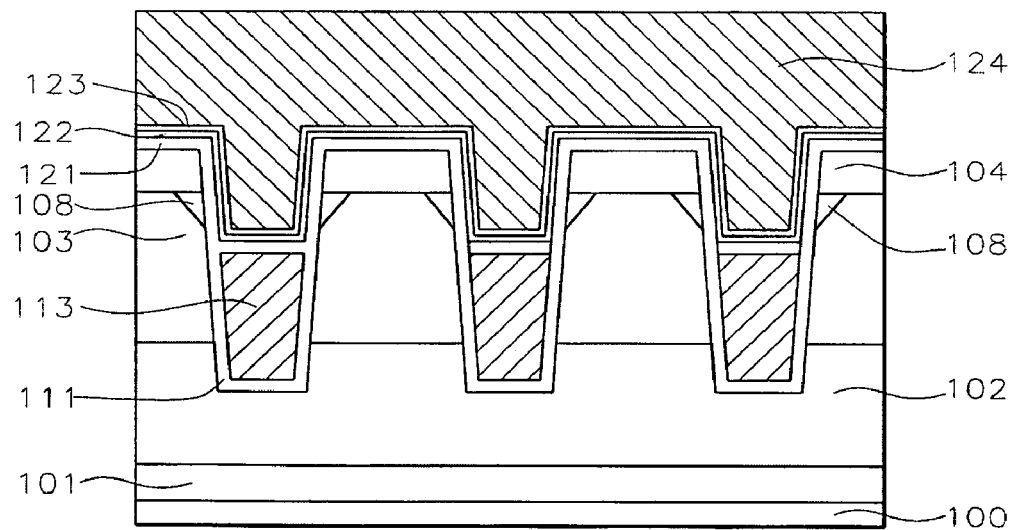

An ONO stacked layer is formed in trench 120 as shown in FIG. 11. A bottom oxide 121 is grown as a conventional gate oxidation process. A nitride layer 122 is deposited by a CVD (chemical vapor deposition). A top oxide 123 is delivered by oxidizing a top portion of the nitride 122 or deposition of high temperature oxide (HTO). Doped polysilicon 124 in FIG. 12 is deposited to plug the control gate trench 120. Conventional lithography provides a control gate mask to pattern the control gate line running along in the second direction crossing the bit lines and select gates running along the first direction. The control gate polysilicon is etched using the control gate mask.

Control gate contact 129 and Bit line contact 109 are placed at the end of the lines as shown in FIG. 5, followed by BEOL (Back end of line) processing to wire metal lines for interconnection.

Figure 13:
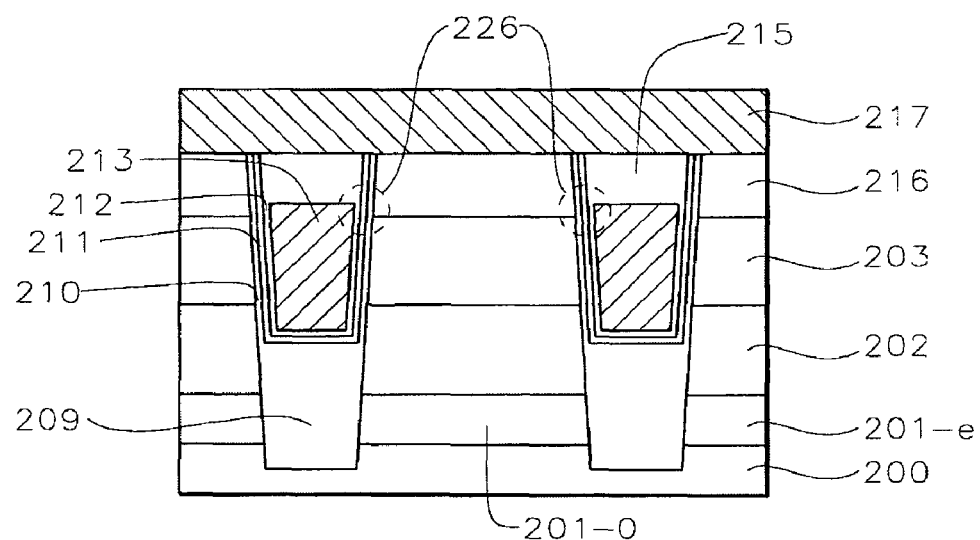
FIG. 13 is a cross-sectional representation of the second embodiment of the present invention.

The cross-sectional memory structure of the second embodiment of the invention is shown in FIG. 13. The vertical channel is in the p-region 203 between top 216 and bottom 201 n-regions along a word gate 213. Insulation 209 under the word gate electrode separates the bottom n+ layer into two independent regions, odd 201-o and even 201-e. A stack layer of Oxide 210, Nitride 211 and oxide 212 is adapted as a word gate dielectric. Silicon Nitride layer 211 is a memory element. Memory storage is shown by 226. A bit line 217 connects top n+ regions 216 in a direction perpendicular to the word line.

A memory cell is selected by the word gate, odd or even bottom n+ region, and a bit line for read and program mode. Program is accomplished by injecting electrons into the nitride storage region located adjacent to the PN junction, where positive voltage is applied to a bit line and a word gate. A selected bottom n+ is grounded. Others are floated or disconnected. For read mode, a positive voltage is applied to the word gate and the selected bottom n+ region. The bit line is grounded.

Figure 14:
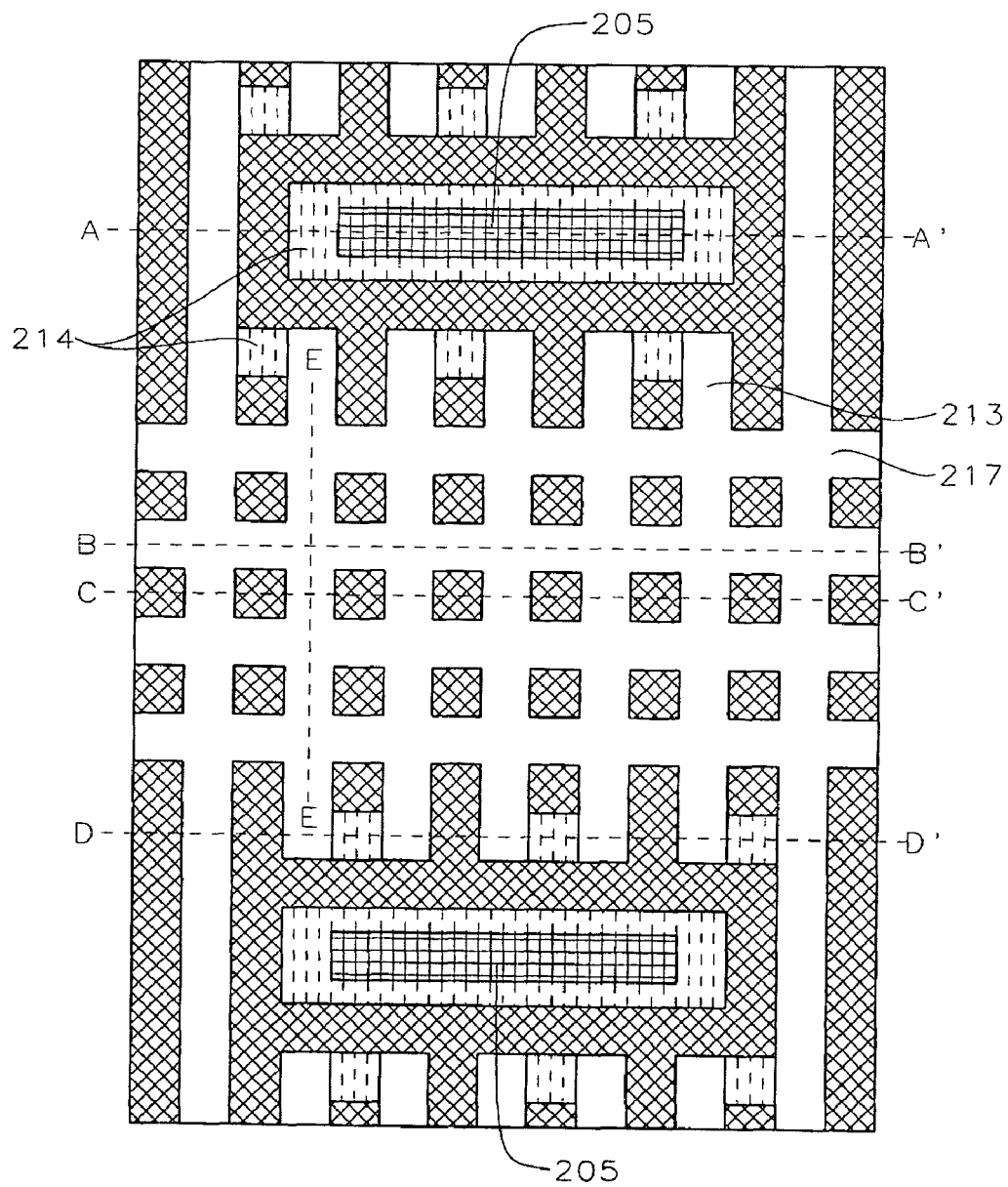
FIG. 14 illustrates a top view of the second embodiment of the present invention.
Figure 15:
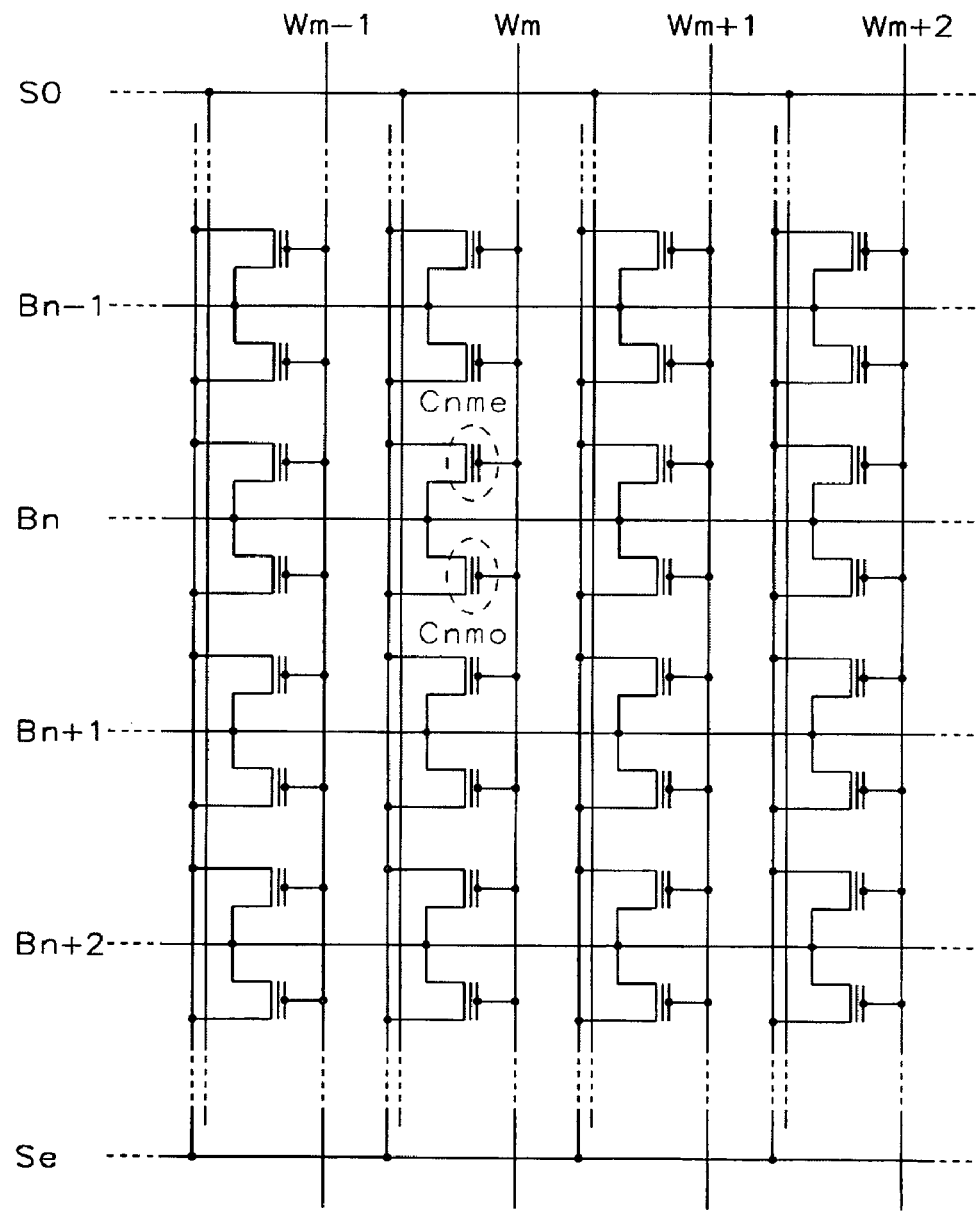
FIG. 15 is an equivalent electrical circuit diagram of the second embodiment of the present invention.
Figure 16:
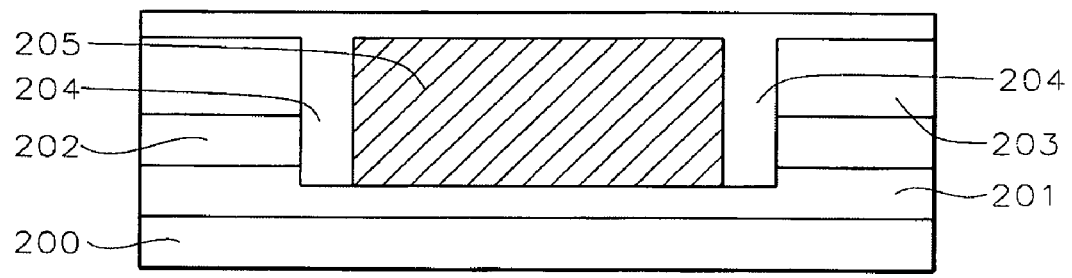
FIG. 16 to FIG. 19 illustrate cross-sectional views of the second embodiment of the present invention.
Figure 17:
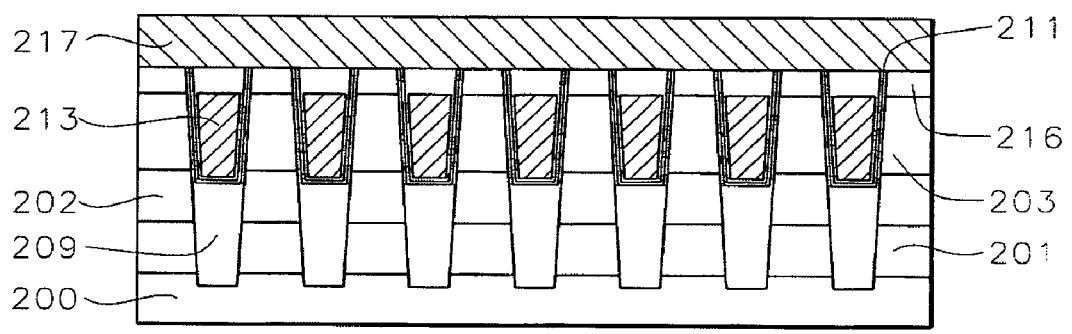
Figure 18:
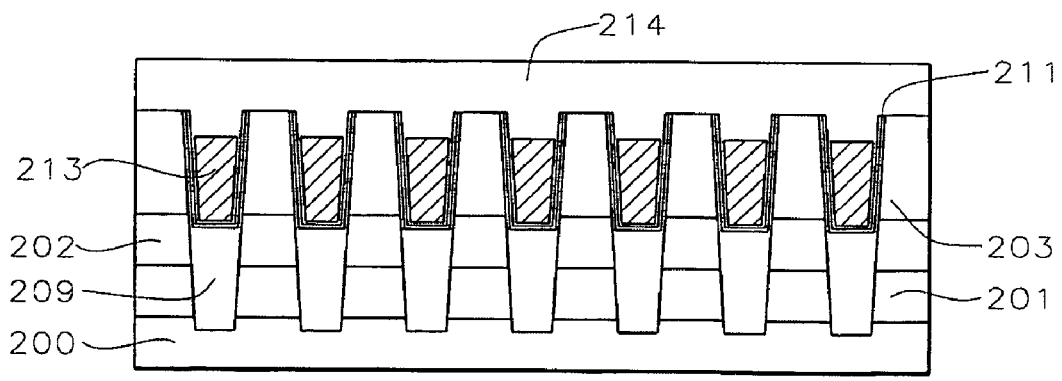
Figure 19:
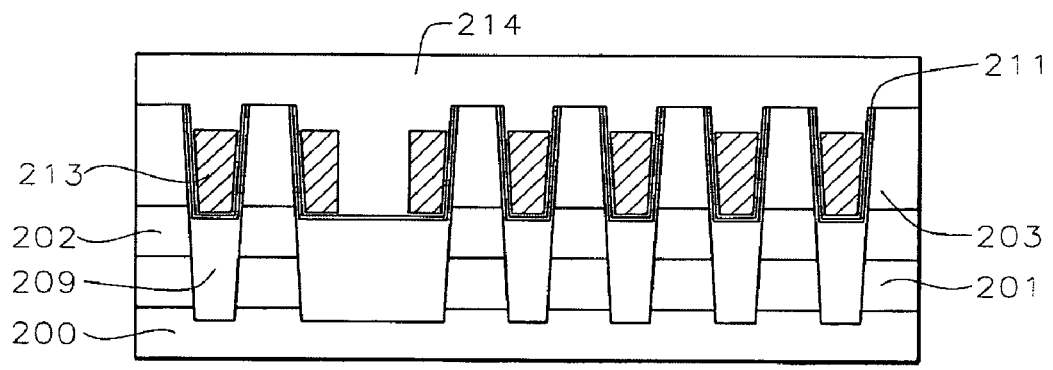

A top view of the second embodiment is shown in FIG. 14. The equivalent electrical circuit of the memory array is shown in FIG. 15. Cross sectional views along A-A', B-B', C-C', D-D' and E-E' in FIG. 14 are shown in FIG. 16, FIG. 17, FIG. 18, FIG. 19 and FIG. 28, respectively. In FIG. 14, plural bit lines 217 run along the first direction. Plural word gate lines 213 run along the second direction crossing the bit lines. The bottom n+ region is separated into two bundled regions by oxide 209 under word gates as shown in FIGS. 17, 18, and 19. Each of two bottom n+ regions 201 is connected to the upper interconnect layers through bottom contact 205 located at the stitch area as shown in FIGS. 14 and 16. Individual word gates are isolated by WL isolation 214 as shown in FIGS. 14 and 19. The top n+ region 216 is self-aligned to bit line 217. The memory element is in the nitride layer 211 in ONO in between top and bottom n+ layers as shown in FIG. 17.

A memory cell (n,m.p) is selected by a bit line BLn, a word line WLm and bottom n+ layer Sp, where p is odd or even, in FIG. 15 for read and program . . . . For read mode, positive voltages are applied to a bit line BLn, a word line WLm and a select bottom n+ Se (for example) is grounded. All others are disconnected. For example, program voltages could be BLn 5V, WLm 5V, Se 0V, all others are floated.

For read mode, positive voltages are applied to even bottom n+ Se (for example), a word gate WLm and 0V to a bit line BLn. All others are floated. Its voltage arrangement of the selected bit line and common source is opposite to that of program.

For example, read voltages could be WLm 1.5V, BLn 0V, Se 1.2V, all others disconnected. A negative voltage is applied to the word gate for the erase operation, a positive voltage is applied to the bit line, and the bottom n+ regions are grounded.

Figure 20:
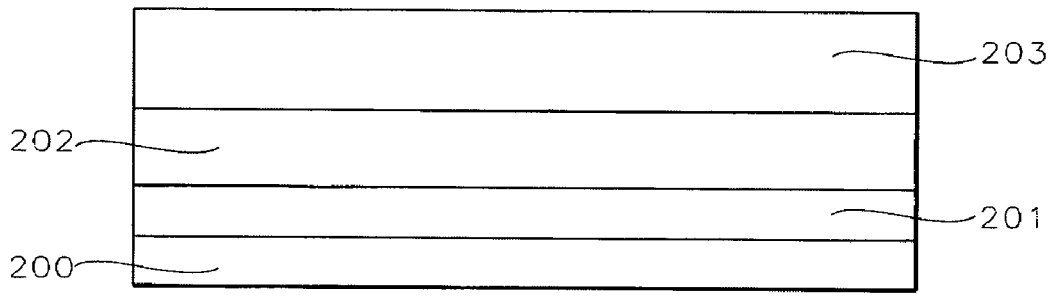
FIG. 20 to FIG. 28 illustrate, in cross-sectional representation, individual fabrication steps of the second embodiment of the present invention.

The fabrication method of the second embodiment of the invention will be described with reference to FIGS. 20 through 28. Referring now more particularly to FIG. 20, a high concentration n type layer 201 is formed over p type substrate 200 with ion implantation or epitaxial growth. A low concentration n type layer 202 is grown over n+ layer 201. The n− layer makes a gentle gradient impurity profile of p-n junction with the upper p type layer. This gradient will prevent injections during a read operation. A p type layer 203 is grown over the n− layer 202.

Figure 21:
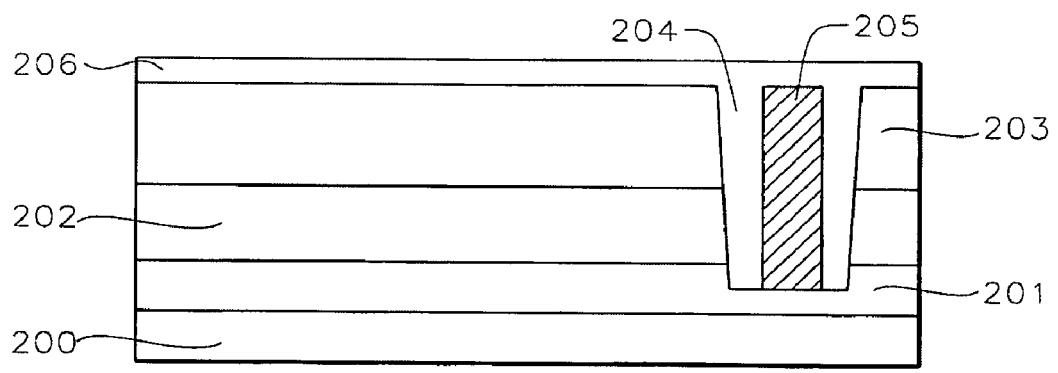
Figure 22:
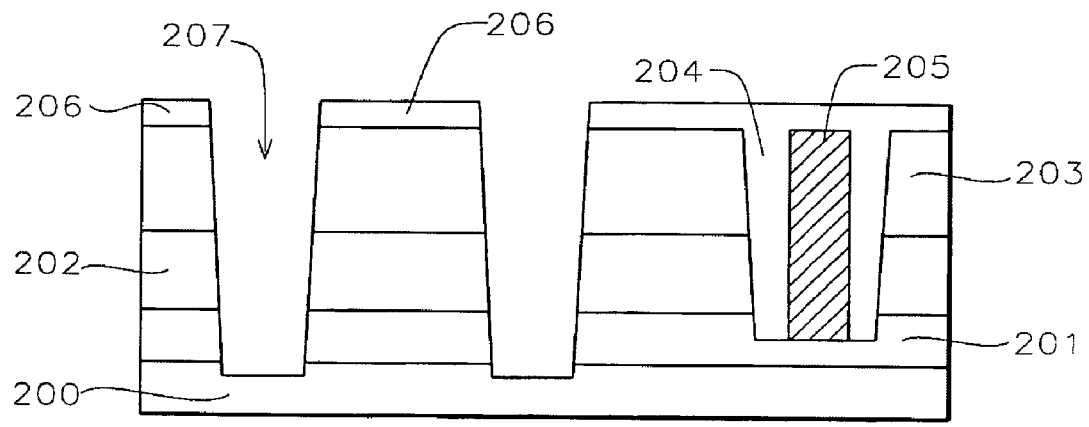
Figure 23:
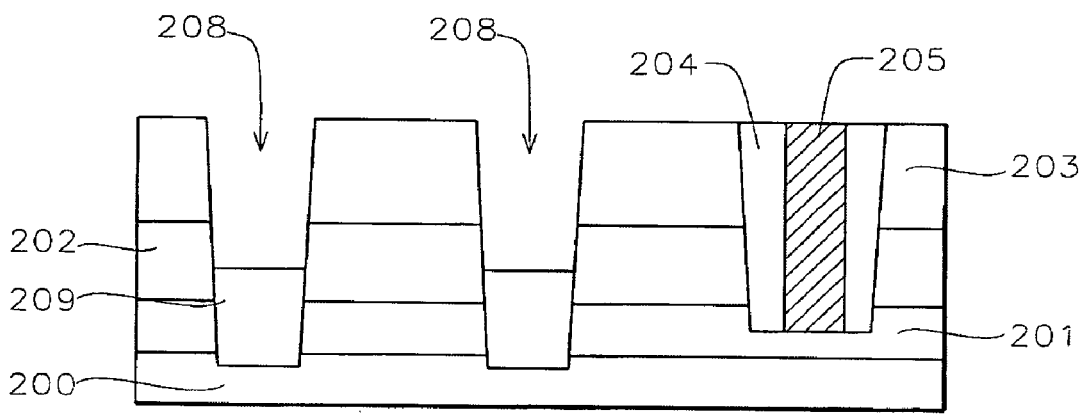
Figure 24:
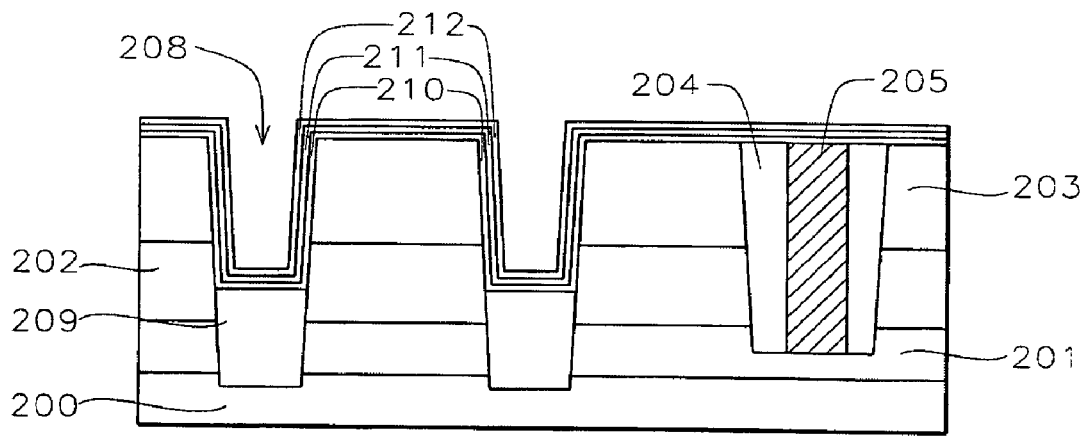
Figure 25:
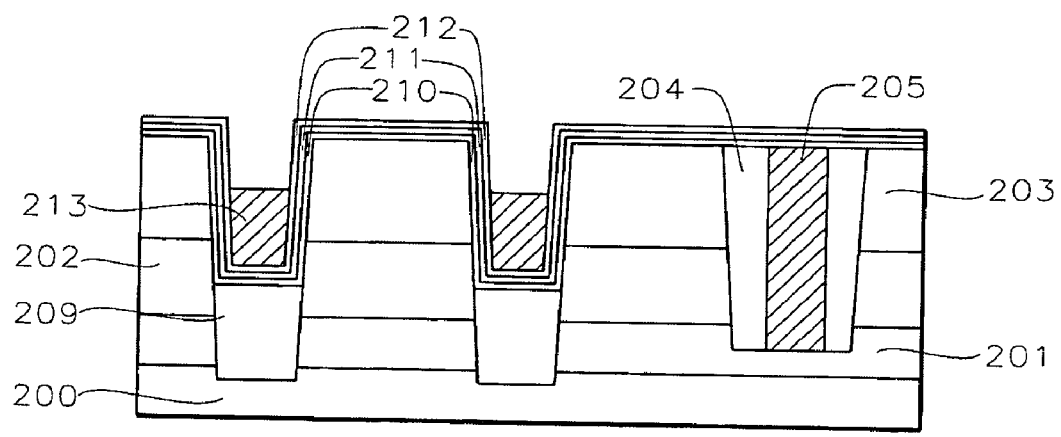
Figure 26:
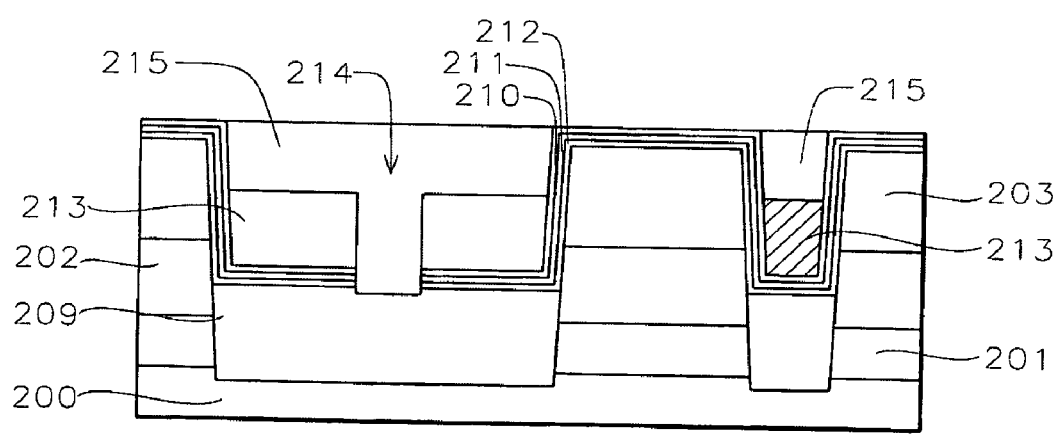

A bottom n+ contact 205 is fabricated as shown in FIG. 21. A trench is opened to bottom n+ layer 201 in the stitch area. Silicon dioxide 204 is plugged into the trench and planarized with CMP. A trench 205 is opened through to the bottom n+ layer in the oxide trench 204 followed by an n+ poly-silicon plug process. Oxide layer 206 is deposited as a hard mask to open trench line of 207 in FIG. 22. The trench line reaches into the p-layer 200 under the bottom n+ layer 201 to isolate the n+ layer. Oxide 209 is deposited to plug in the trench and is planarized with CMP. The oxide 209 is recessed into the n− layer 202 as shown in FIG. 23. A memory gate is to be created in a trench 208. A bottom oxide 210, nitride 211 and top oxide 212 are formed in the trench 208 as shown in FIG. 24. A word line n+ poly silicon 213 is deposited and recessed to half way through the p-layer 203 as shown in FIG. 25. To separate word line 213, isolation 214 is opened as shown in FIG. 26, a cross-sectional view of FIG. 14 along D-D'. An Oxide layer 215 is deposited to plug open trenches and over word line surfaces followed by planarization, if necessary.

Figure 27:
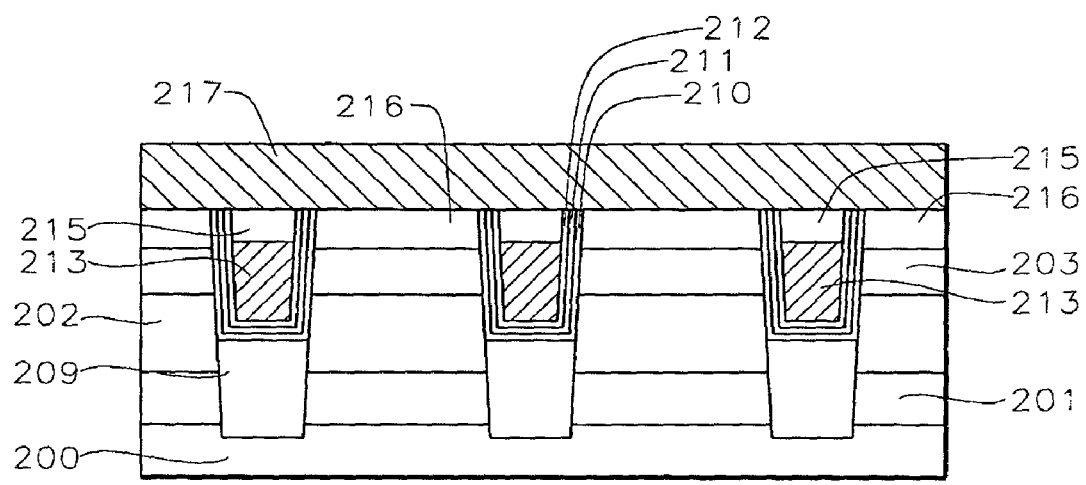
Figure 28:
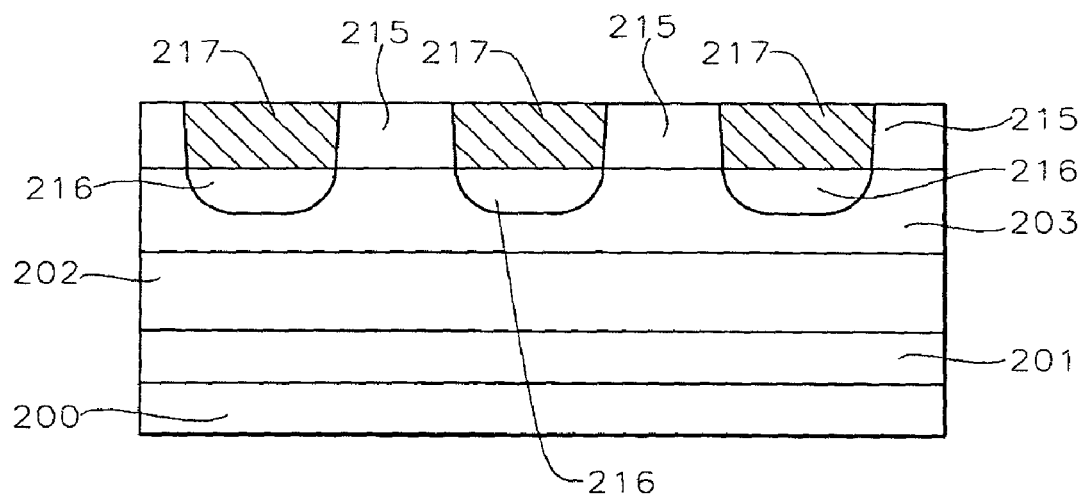

Trench lines 217 crossing the word line 213 are opened through to p-layer 203 to create bit lines shown in FIG. 27 and FIG. 28. FIG. 27 and FIG. 28 are cross-sectional views of FIG. 14 along B-B' and E-E', respectively. n type species are implanted into the p-layer to form top n+ regions 216 for top p-n junction as shown in FIG. 27 and FIG. 28. n+ polysilicon or Tungsten or another conductive material is plugged in the trench 217 followed by CMP to remove excess tungsten or polysilicon deposited out of the trench to form a bit line. This is followed by a contact process and metal wiring.

The MONOS vertical memory cell of the present invention allows miniaturization of the memory cell area. The two embodiments of split gate and single gate provide for efficient program and erase modes as well as preventing read disturb in the read mode.

While the invention has been particularly shown and described with reference to the preferred embodiments thereof, it will be understood by those skilled in the art that various changes in form and details may be made without departing from the spirit and scope of the invention.

What is claimed is:

1. A MONOS memory cell comprising:
    a select gate in a bottom portion of a trench in a semiconductor substrate; and
    a control gate in a top portion of said trench,
    wherein an ONO memory element separates said select gate from said control gate,
    wherein a channel of said memory cell is in a p-region between top and bottom n-regions of said semiconductor substrate along said trench gate,
    wherein a bottom of said select gate is located deeper than the bottom p-n junction defined by the boundary of said bottom n-region and said p-region, and wherein the bottom of said control gate is lower than the top junction defined by the boundary of said top n-region and said p-region.

2. The MONOS memory cell according to claim 1 wherein a channel length of said select gate is given by a distance from the top of said select gate to said boundary of said bottom n-region and said p-region.

3. A MONOS memory cell in an array of a plurality of said memory cells, wherein said MONOS memory cell comprises:
    a select gate in a bottom portion of a trench in a semiconductor substrate; and
    a control gate in a top portion of said trench wherein an ONO memory element separates said select gate from said control gate; and
    wherein said array comprises:
        a plurality of control gate lines connecting said control gates and extending in a first direction;
        a plurality of said select gates extending in a second direction crossing said first direction; and
        a plurality of bit lines extending in said second direction wherein said select gate lines surrounding said bit lines are separated by an edge cut into two parts to select an odd or even bit line space.

4. The MONOS memory cell in an array according to claim 3 wherein a control gate contact is placed at an end of each of said control gate lines.

5. The MONOS memory cell in an array according to claim 3 wherein a bit line contact is placed at an end of each of said bit lines.

6. The MONOS memory cell in an array according to claim 3 wherein a select gate contact is placed in each of said odd and even parts.

7. The MONOS memory cell in an array according to claim 3 wherein a memory cell is selected by a control gate line, a bit line, and a select gate.

8. The MONOS memory cell in an array according to claim 7 wherein a memory cell is programmed by:
    applying positive voltages to said selected control gate, bit line, and select gate; and
    grounding all other control gates, bit lines, and select gates.

9. The MONOS memory cell in an array according to claim 7 wherein a memory cell is read by:
    applying positive voltages to a common source, a control gate, and a select gate; and
    grounding all bit lines, unselected control gates, and unselected select gates.

10. The MONOS memory cell in an array according to claim 7 wherein a memory cell is erased by:
    applying a negative voltage to a control gate;
    applying a positive voltage to a bit line;
    grounding the common source; and
    applying a zero or negative voltage to the select gate.

11. The MONOS memory cell in an array according to claim 3 wherein a channel of said memory cell is in a p-region between top and bottom n-regions of said semiconductor substrate along said trench gate.

12. The MONOS memory cell in an array according to claim 11 wherein a bottom of said select gate is located deeper than the bottom p-n junction defined by the boundary of said bottom n-region and said p-region and wherein the bottom of said control gate is lower than the top junction defined by the boundary of said top n-region and said p-region.

13. The MONOS memory cell in an array according to claim 12 wherein a channel length of said select gate is given by a distance from the top of said select gate to said boundary of said bottom n-region and said p-region.

* * * * *